United States Patent [19]

Izumita et al.

[11] Patent Number: 4,868,853
[45] Date of Patent: Sep. 19, 1989

[54] DEMODULATION CIRCUIT FOR DIGITAL MODULATED SIGNAL

[75] Inventors: Morishi Izumita, Inagi; Seiichi Mita, Kanagawa; Nobukazu Doi, Hachioji; Masuo Umemoto, Tokyo; Hiroto Yamauchi, Katsuta; Shigeaki Fujino, Higashimurayama; Nobuo Murata, Musashino, all of Japan

[73] Assignee: Hitachi, Ltd., Tokyo, Japan

[21] Appl. No.: 181,528

[22] Filed: Apr. 14, 1988

[30] Foreign Application Priority Data

Apr. 15, 1987 [JP] Japan .................................. 62-90794
Sep. 8, 1987 [JP] Japan ................................ 62-223025

[51] Int. Cl.$^4$ ............................................. H04L 7/04
[52] U.S. Cl. .................................... 375/111; 375/116; 360/41; 360/44

[58] Field of Search ............... 375/111, 114, 116, 120, 375/87, 118, 119; 360/42, 44, 41

[56] References Cited

U.S. PATENT DOCUMENTS

4,759,040   7/1988   Kawata et al. ...................... 375/120

Primary Examiner—Robert L. Griffin
Assistant Examiner—Marianne Huseman
Attorney, Agent, or Firm—Antonelli, Terry & Wands

[57] ABSTRACT

A demodulation circuit for demodulating a modulated digital including a unit for detecting a specific pattern contained in a series of data before modulation, a unit for judging the phase relation between the specific pattern and a clock pulse used for demodulation, a unit for performing a counting operation on the basis of the result of said judgment, and a unit for controlling the phase of said clock pulse for demodulation on the basis of the count.

8 Claims, 8 Drawing Sheets

DEMODULATION CIRCUIT FOR DIGITAL MODULATED SIGNAL

BACKGROUND OF THE INVENTION

The present invention relates to a demodulation circuit for a digital modulated signal used to transmit or record/reproduce digital signals.

When a digital signal is to be transmitted or recorded, it is necessary to convert or modulate the signal into a form suitable to the transmission path or the recording medium.

Modulation techniques for digital signals, the MFM (Modified Frequency Modulation) technique, the Miller$^2$ technique, and the ZM (Zero Modulation) technique are known.

A digital signal modulated by the MFM technique has two possible inversion locations. That is to say, the digital signal modulated by the MFM technique is inverted in the middle of a data transfer period or inverted in synchronism with a data transfer period. In case of a datum "1", for example, the digital signal is inverted in the middle of a transfer period of the data "1". When a datum "0" is followed by another datum "0", the digital signal is inverted at the boundary between those data, i.e., at such a location as to be in synchronism with the transfer period. For a single datum "0", the digital signal is not inverted.

The MFM signal has features that the difference between the maximum value of the inversion interval of a signal and its minimum value is large and the timing information (clock) can easily be extracted. And the MFM signal is used in a number of apparatuses. The Miller$^2$ signal is nearly the same as the MFM signal. The MFM signal will now be described by referring to FIG. 2.

Figure 2:
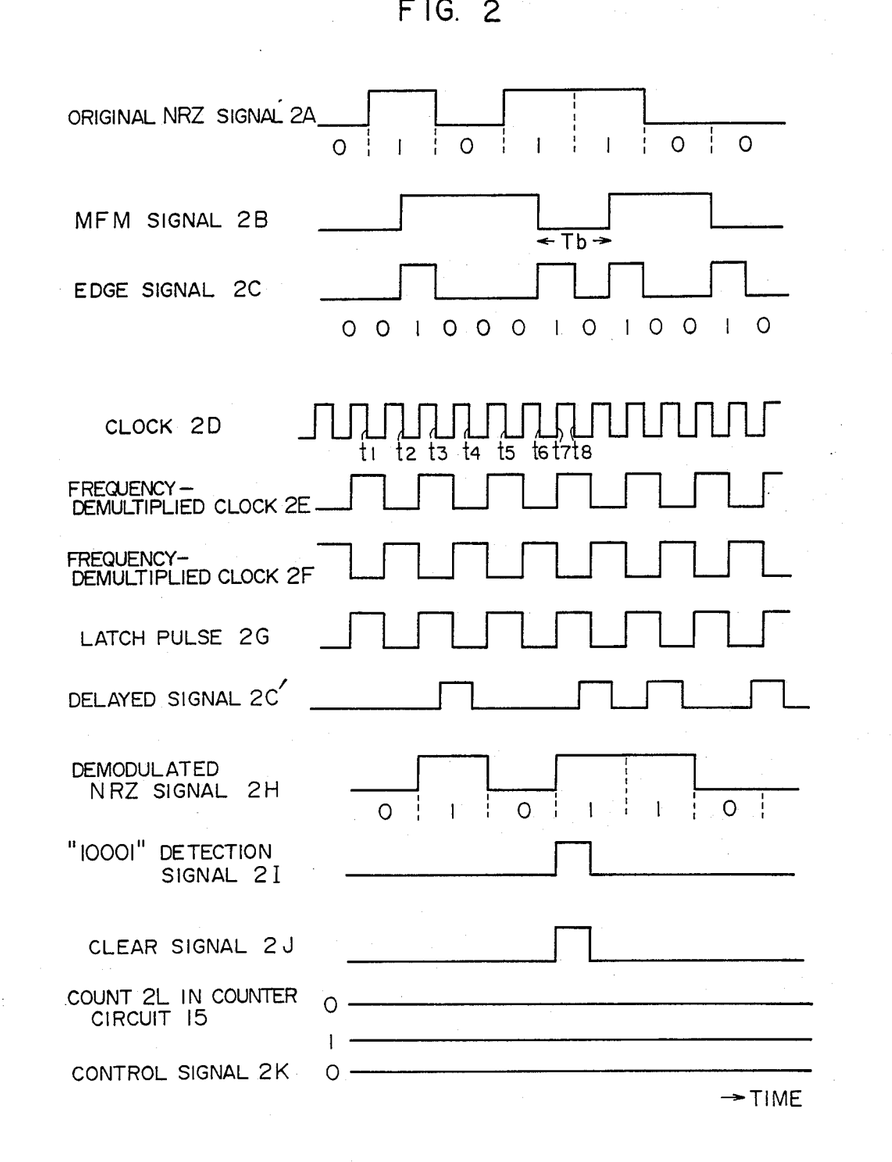
FIG. 2 is a timing chart showing signal waveforms at various portions of a demodulation circuit obtained when obtained when an error is not caused in a reproduced MFM'signal.

In FIG. 2, a waveform 2A represents an example of an NRZ signal before modulation. A waveform 2B represents the NRZ signal after the MFM modulation. In the MFM modulation technique, inversion in polarity is associated with "1" of the input signal 2A, while non-inversion in polarity is associated with "0". When two data "0", appear in succession, the polarity is inverted at the connection point between two data.

For demodulating this MFM-modulated signal, the clock signal must be extracted from the signal 2B first of all. For example, an edge signal 2C corresponding to the rising edge/falling edge of data is produced from the signal 2B. From the signal 2C, clock pulses 2D are produced by using a tank circuit or a PLL circuit or the like. Succeedingly, the clock pulses 2D undergo frequency demultiplication with a ratio of 2 to produce pulses 2E and 2F having opposite phases with respect to each other. One of these pulses, 2E for example is used as a latch pulse 2G. The latch pulses 2G latches the edge signal 2C, the original NRZ signal being thus modulated as a signal 2H.

However, it is not known which pulse of 2E and 2F should be selected as the latch pulse. It must be decided by other information for selection.

Two methods have been proposed as the method for deciding the latch pulse. In accordance with one of these methods, a fixed pattern such as information of "1" and/or "0" within a predetermined period is recorded, and the latch pulse is selected on the basis of this information. This method is used in apparatuses such as magnetic disks.

However, this method has two drawbacks described below. The first drawback will now be described. Since redundancy for inserting a fixed pattern into the original NRZ signal is needed, complicated signal processing is required for the modulation circuit. In addition, a circuit for detecting the fixed pattern is needed in the demodulation circuit. The second drawback will now be described. A fixed pattern is inserted only intermittently at long time intervals. Should the number of clocks change due to disturbance such as dropout, all data appearing since then until the detection of the fixed pattern are demodulated erroneously.

As a second method for deciding the latch pulse, a method using the conversion rule of the MFM signal is proposed in J-P-B No. 54-38884, for example. A method for deciding the latch pulse using the conversion rule of the Miller$^2$ signal is proposed in J-P-A No. 52-114206, for example.

When the conversion rule of the MFM signal is used, the maximum value of an interval during which the polarity of the MFM signal is not inverted, i.e., a term between polarity conversion points is equal to four repetition periods of the clock pulse 2D. This maximum value is obtained only when a pattern "101" appears in the original NRZ signal. This pattern corresponds to a pattern "10001" in the edge signal 2C. In the waveform of FIG. 2, a pattern formed from time $t_2$ to time $t_8$ is "10001". In case this pattern has been detected, therefore, it is possible to define a correct latch pulse from a phase (time $t_7$) where the last information "1" of the pattern "10001" of the edge signal is latched.

That is to say, the pulse 2E is decided to be the latch pulse 2G in case of FIG. 2.

If the condition of the apparatus or the recording medium is aggravated, however, an erroneous "10001" pattern might appear in the edge signal of reproduced data. When the second method is used, therefore, there is a possibility that an erroneous latch pulse is selected. This error causes a problem that all data become erroneous until the next correct pattern "10001" is reproduced.

Figure 3:
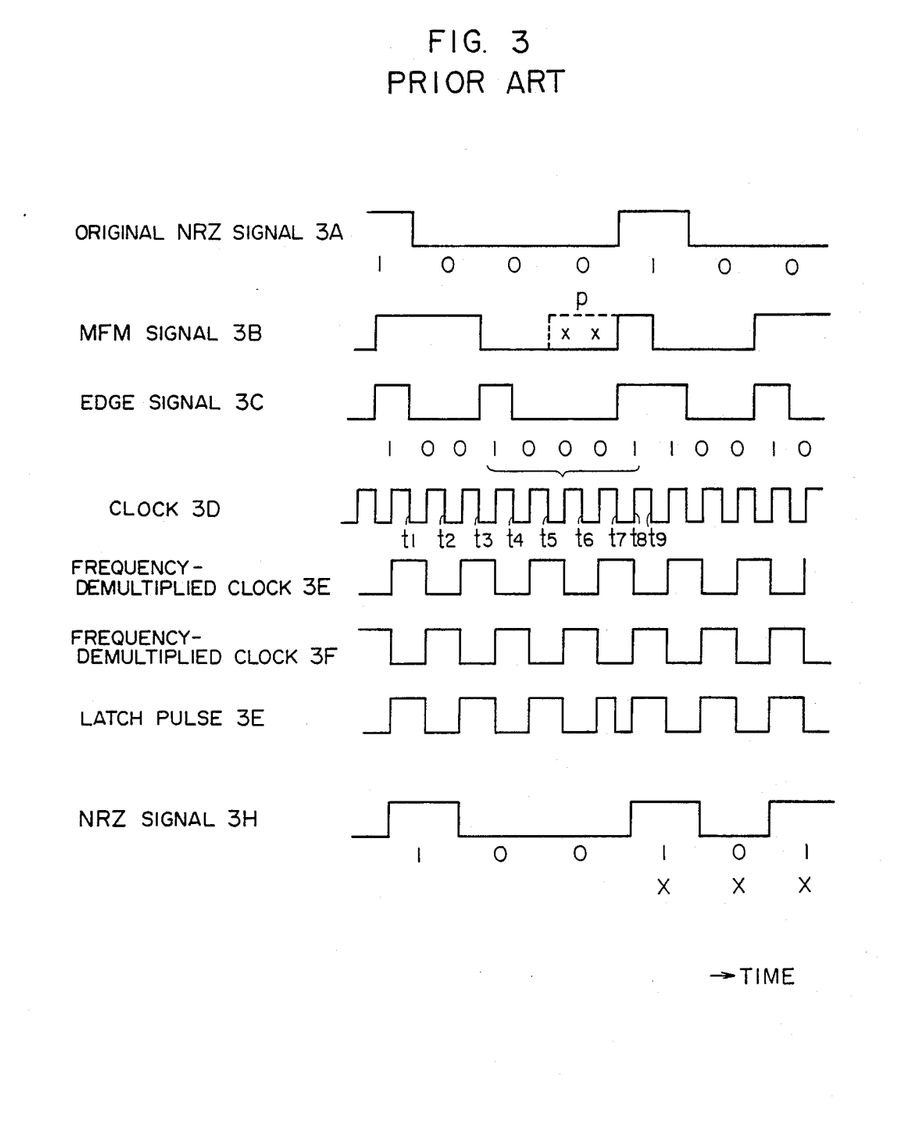
FIG. 3 a timing chart showing signal waveforms at various portions of a demodulation circuit obtained when an error is caused in the reproduced MFM signal.

FIG. 3 shows an original NRZ signal 3A and an MFM signal 3B obtained when an erroneous pattern "10001" is produced in the edge signal because of an error caused in the MFM reproduced signal.

Although the MFM reproduced signal 3B should change to "1" at time $t_5$ as indicated by broken lines, the signal 3B erroneously remains at "0". Therefore, the detected edge signal 3C produces an erroneous pattern "10001" between time $t_3$ and time $t_9$.

From this detected edge signal 3C, a clock pulse 3D is extracted. Waveforms 3E and 3F represent pulse obtained by applying frequency demultiplication to the clock pulses 3D. One of these waveforms, 3E for example is selected as a latch pulse 3G. If an erroneous pattern "10001" of the detected edge signal is detected at a location p of the MFM signal 3B, the output 3G of the latch pulse is changed from 3E to 3F at time $t_7$. Since then, all data are erroneously demodulated, an erroneous NRZ signal 3H being thus outputted. In the illustrated NRZ signal 3H, portions indicated by marks x are erroneous.

Such a drawback is caused not only in a demodulation circuit for the MFM signal but also in demodulation circuits for the Miller$^2$ signal and the ZM signal.

Assuming now that the data transfer period of the modulated digital signal is $T_b$ in an example of a prior art circuit for demodulating digital signals modulated by the MFM technique and recorded on a recording medium, the repetition period of the clock 3D required for the demodulation circuit is set to half of $T_b$ as described in J-P-B No. 54-38884, for example.

When the MFM digital modulation technique is used, the input digital signal has the same transfer speed as that of the digital signal after modulation, the modulation technique being thus suitable to high speed recording. For discriminating a datum "1" from a datum "0", however, phase difference within one repetition period is used. Accordingly, an interval for discriminating a datum, i.e., a so-called detection window width becomes $T_b/2$. As a result, the frequency becomes as high as $2/T_b$.

In the above described prior art, disposal for a case where very high speed clocks are needed is not considered in view of the fact that the clock frequency is twice as high as the data transfer speed. In a digital VTR needing high speed recording as high as 100 to 150 Mb/s per channel, for example, the clock frequency becomes 200 to 300 MHZ. Accordingly, the waveform transmission on the substrate circuit becomes difficult because of waveform distortion, attenuation and the like. In addition, the corresponding components become expensive. Because of these problems on mounting, the above described prior art was not put into practical use for such high-speed recording.

These problems were caused in not only demodulation circuits for MFM signals but also in demodulation circuits for Miller$^2$ signals, ZM signals and the like.

SUMMARY OF THE INVENTION

A first object of the present invention is to provide a demodulation circuit capable of producing a correctly demodulated signal even if the modulated digital signal contains erroneous data.

A second object of the present invention is to provide a demodulation circuit capable of demodulating a modulated digital signal at the same clock period as the transfer speed of the digital data.

Erroneous demodulation effected when a modulated digital signal such as an MFM signal contains an erroneous datum, i.e., a specific erroneous pattern is caused by the fact that the phase of the latch pulse is unconditionally changed over upon occurrence of the specific pattern in the MFM signal.

In accordance with a feature of the present invention, therefore, a unit for judging whether the phase of the latch pulse is correct or not and a unit for deciding a latch pulse on the basis of the past history are provided in addition to a unit for detecting the specific pattern in order to prevent the above described erroneous demodulation.

When a specific pattern ("10001") of a modulated digital signal such as an MFM signal is detected in a demodulation circuit according to the present invention, a coincidence signal is generated when the specific pattern is demodulated to a pattern ("101") of the NRZ signal, while a noncoincidence signal is generated otherwise. Only when noncoincidence is consecutively caused by a predetermined number of times, the phase of the latch pulse is changed over. Even if the specific pattern is generated erroneously, therefore, the occurrence probability of erroneous operation can be largely reduced.

In order to achieve the second object of the present invention, a demodulation circuit according to the present invention includes a circuit for comparing an output obtained by successive latching the modulated digital signal with first and second clocks with an output obtained by latching the modulated digital signal with the second clock and for producing original data, i.e., a signal output inverted upon occurrence of a datum "1" before modulation, each of the first clock and second clock having a period equivalent to the data transfer period, the first clock being inverted in polarity with respect to the second clock, a circuit for taking out two signal outputs from the above described signal output via a flip-flop activated by the second clock and for supplying the two signal outputs to an exclusive OR circuit to produce a demodulated output of the above described modulated digital signal, the two signal outputs being equivalent in waveform to the signal output inverted upon the occurrence of a datum "1" before modulation, the two signal outputs having a relative phase difference equivalent to one period, a circuit for extracting two clocks having a period equivalent to the above described data transfer period, one of the two clocks being inverted in polarity with respect to the other of the two clocks, and a clock selection circuit for detecting a specific pattern contained in the above described modulated digital signal, for selecting a normal clock and its inverted clock on the basis of the phase relationship between the detected specific pattern and the above described two extracted clocks, and for sending out the normal clock and its inverted clock as the above described first and second clocks.

In the above described circuit for producing the signal output inverted upon the occurrence of a datum "1" before modulation, the output obtained by successively latching the modulated digital signal with the first and second clock becomes equivalent to the output obtained by latching the above described modulated digital signal with the second clock with respect to the information of a datum "1" before modulation. On the contrary, the former output differs from the latter output with respect to the inverted information of a datum "0" before modulation. Therefore, the output of the circuit for comparing these outputs to find coincidence between them provides information of a datum "1" before modulation.

If the information of data "1" before modulation is obtained, the original digital signal can be demodulated by regarding data existing before modulation at locations where data "1" before modulation are not found as "0". That is to say, demodulation using a clock having a period equivalent to the above described data transfer period can be realized.

In a circuit for producing the demodulated output of the modulated digital signal succeeding a circuit portion for producing the signal output inverted upon the occurrence of a datum "1" before modulation, a waveform assuming a high potential level for a datum "1" before modulation and assuming a low potential level for a datum "0" before modulation, i.e., the original digital signal waveform is produced from two signal output waveforms having information of data "1" before modulation, the demodulation being thus completed.

If the phase relationship between the modulated digital signal and the above described first and second clocks is shifted, an error is caused in demodulation. The clock extraction and selection circuit sets the first and second clocks in a correct phase relation with respect to the modulated digital signal.

DESCRIPTION OF THE PREFERRED EMBODIMENT

Demodulation circuits for modulated digital signals according to the present invention will now be described.

First of all, an embodiment in which occurrence of erroneously demodulated data is prevented upon occurrence of an erroneous specific pattern in a modulated digital signal will now be described.

Figure 1:
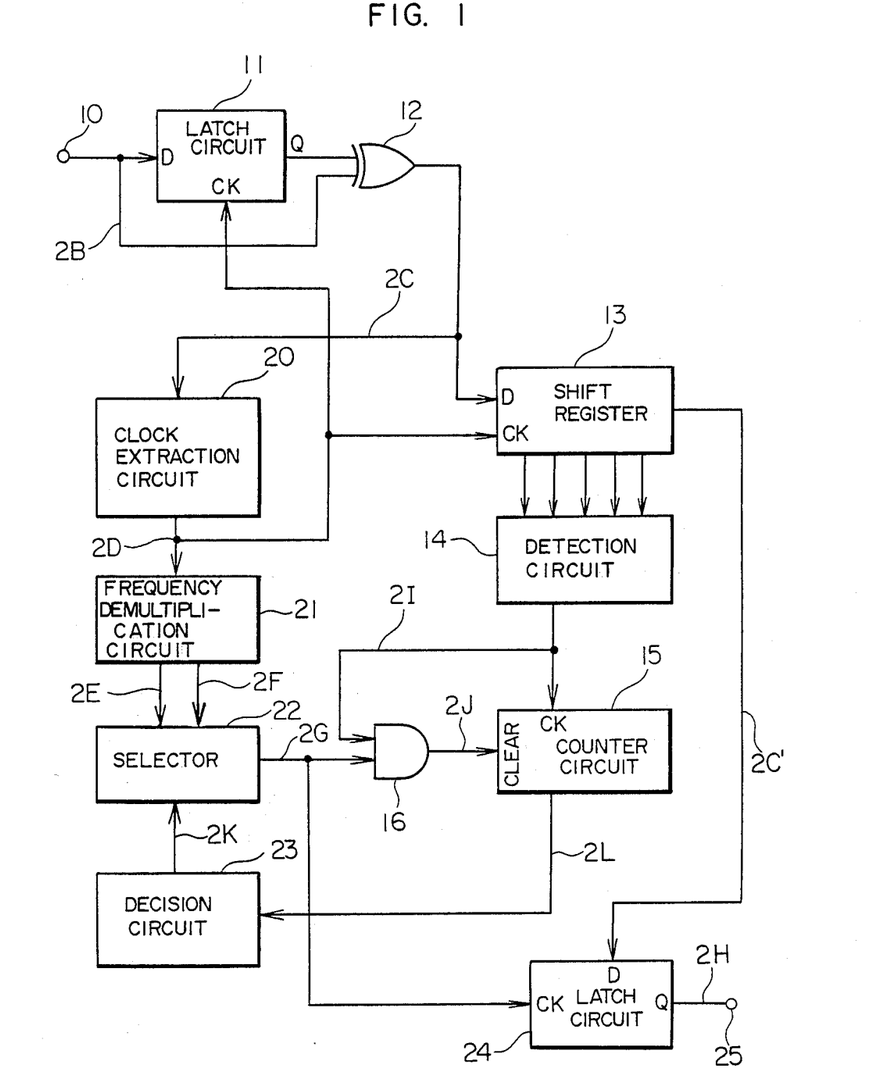
FIG. 1 is a block diagram showing an embodiment of a demodulation circuit according to the present invention.
Figure 4:
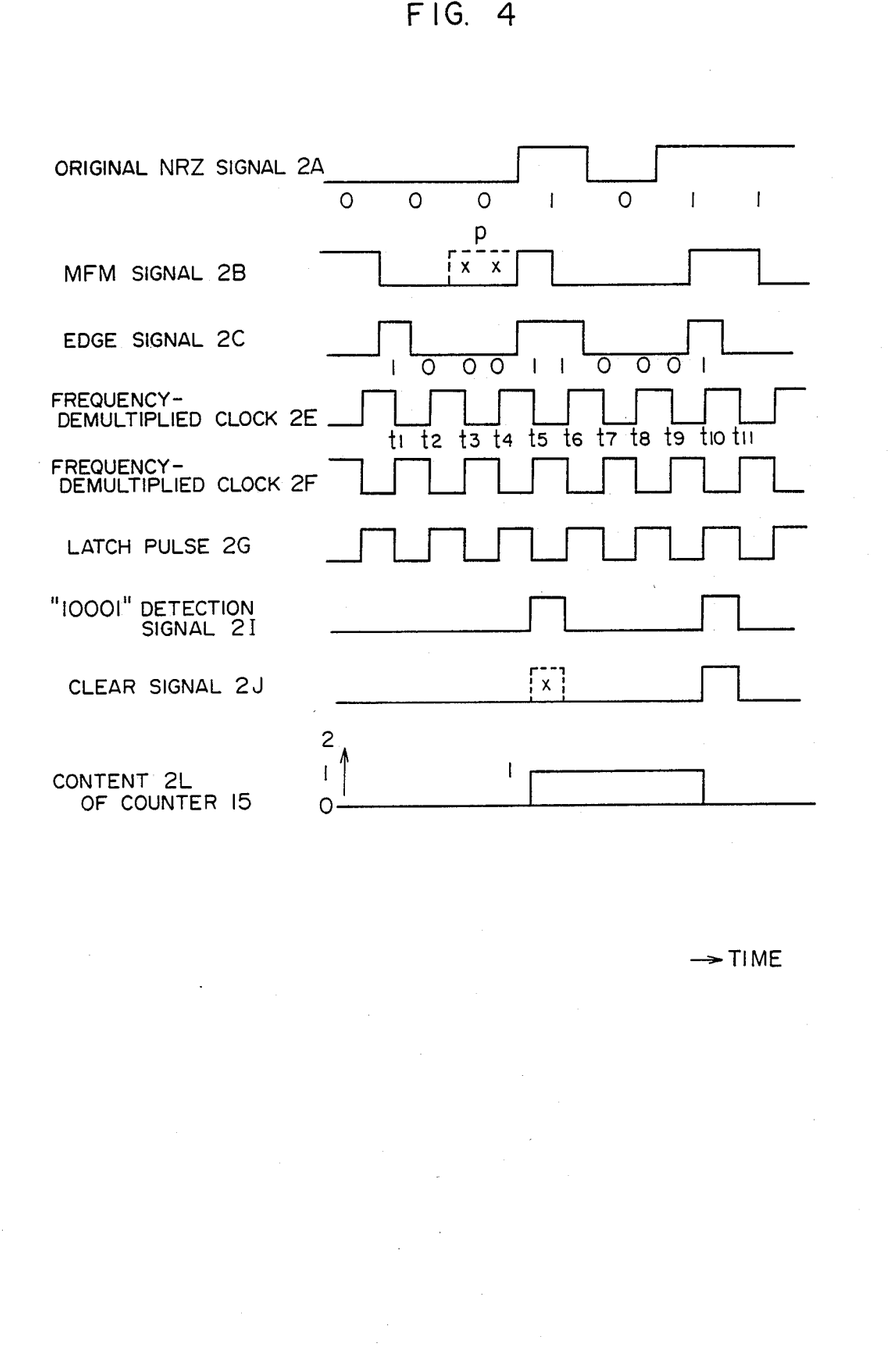
FIG. 4 is a timing chart showing signal waveforms at various of the demodulation circuit obtained when an error is caused in the reproduced MFM signal.

FIG. 1 is a block diagram showing the circuit configuration of a typical example of the present embodiment. FIG. 4 shows signal waveforms appearing at various portions of the demodulation circuit of FIG. 1.

The present embodiment will now be described by referring to a case where an MFM signal is used as the modulated digital signal.

First of all, demodulation of an MFM signal in case an error is not caused in the MFM signal will now be described.

An NRZ signal 2A shown in FIG. 2 undergoes MFM modulation to produce an MFM signal 2B. This signal 2B is transmitted and inputted at an input terminal 10 of FIG. 1. The signal 2B is inputted to a D input of a latch circuit 11 and an exclusive OR circuit 12. The exclusive OR circuit produces an edge signal 2C corresponding to rising and falling edges of the signal 2B. This edge signal 2C is inputted to a clock extraction circuit 20 including a tank circuit or a PLL circuit. The clock extraction circuit 20 produces a clock pulse 2D synchronized to the MFM signal. Subsequently, this clock pulse 2D is supplied to a clock input CK of the latch circuit 11, a clock input CK of a shift register 13 and a frequency demultiplication circuit 21. This frequency demultiplication circuit 21 produces frequency-demultiplied clocks 2E and 2F having opposite phases and supplies them to a selection circuit (selector) 22. On the basis of a control signal 2K which will be described later, the selector 22 outputs either one of frequency-demultiplied clocks 2E and 2F as a latch pulse 2G. It is now assumed that the clock 2E is selected in this example.

On the other hand, the edge signal 2C is delayed in the shift register 13 by a predetermined time. Signals at respective stages, say, five stages of the shift register 13 are supplied to a detection circuit 14 for detecting a specific pattern such as a pattern "10001" contained in the edge signal 2C. When the detection circuit 14 detects a signal "10001" in signals supplied from respective stages of the shift register 13, the detection circuit 14 outputs a detected signal 2I to a clock input of a counter circuit 15 and a gate circuit such as an AND gate 16. The latch pulse 2G is supplied to the gate circuit 16 concurrently with application of the detected signal 2I. If the gate circuit 16 is latched by the correct frequency-demultiplied clock pulse, the pulse 2E in this case, therefore, a clear signal 2J becomes "1". This clear signal 2J is supplied to a clear input of a counter circuit 15 to clear the counter circuit 15. Since the counter circuit 15 is thus always cleared under the normal condition, the correct latch pulse 2G continues to be outputted. In this case, a control signal 2K has a constant value ("1", for example). A delayed signal 2C' which is obtained by delaying the edge signal 2C of the MFM signal by $T_b/2$ is latched in a latch circuit 24 by the latch pulse 2G. As a result, the original NRZ signal can be demodulated as the signal 2H. The demodulated output is supplied to an output terminal 25.

If the phase of the latch pulse 2G is erroneous and the pattern "10001" is detected, the output signal 2J of the gate circuit 16 becomes "0". Therefore, the counter circuit 15 is not cleared and counts the signal 2I. It is judged by a decision circuit 23 whether the count output 2L of the counter circuit 15 has reached a predetermined preset value, say, 2. When the preset value is reached, the control signal 2K is inverted, i.e., the control signal is changed to a logic "0" level. Accordingly, the phase of the latch pulse 2G is changed over to the correct phase. That is to say, instead of a pulse used until then, for example the pulse 2E, the pulse 2F is outputted as the latch pulse by the selector 22.

A case where an erroneous pattern "10001" appears in the edge signal only once due to an error caused in the MFM signal will now be described by referring to the waveform diagram of FIG. 4. In FIG. 4, the same designation as that of FIG. 2 denotes a signal waveform appearing at an identical circuit portion in FIG. 1.

If an error is caused at a point p of the MFM signal 2B shown in FIG. 4 and hence an erroneous pattern "10001" appears in the edge signal 2C (from time $t_1$ to time $t_5$), the detected signal 2I outputted by the detection circuit 14 becomes "1" (at time $t_5$) However, the logical product of this detected signal 2I and the latch pulse 2G becomes zero because their phases are different each other. Accordingly, the clear signal 2J outputted by the gate circuit 16 remains at a logical "0". Hence the counting operation is performed in the counter circuit 15, and the count 2L becomes 1. Since the preset value is 2, however, the decision circuit 23 does not change under this state. As a result, the frequency-demultiplied clock signal 2E remains selected as the latch pulse 2G.

When a correct pattern "10001" is detected (at time $t_6$ to time $t_{10}$), the clear signal 2J becomes "1" (at time $t_{10}$) Accordingly, the count in the counter circuit 15 is cleared, and the counter circuit 15 starts its counting operation from zero again. Even if an erroneous pattern "10001" occurs, the specific pattern is regarded as an error and the latch pulse 2G is not changed over provided that the number of times of consecutive occurrence of the erroneous pattern "10001" does not exceed the preset value.

Upon occurrence of an erroneous specific pattern, therefore, the selector 22 does not cause false operation and is able to select a correct latch pulse. The preset value need not be 2, but may be an arbitrary number not less than 2.

In addition, this demodulation method can also be used together with the above described technique using a fixed pattern, resulting in further improved reliability.

A case of the MFM signal has heretofore been described. In case of a Miller² signal, however, a similar effect can be attained in configuration similar to that of FIG. 1 by detecting a pattern "0101" in the original data.

In the present embodiment of a demodulation technique for modulated digital signal heretofore described, it is possible to decide the phase of the latch pulse correctly by detecting a specific pattern contained in the modulated digital signal. Further, the reliability of the latch pulse ca be ensured even if an error should occur in data. Modulated digital signals can thus be demodulated correctly.

An embodiment capable of demodulating modulated digital signals at a clock period equivalent to the transfer speed of digital data will now be described.

Figure 5:
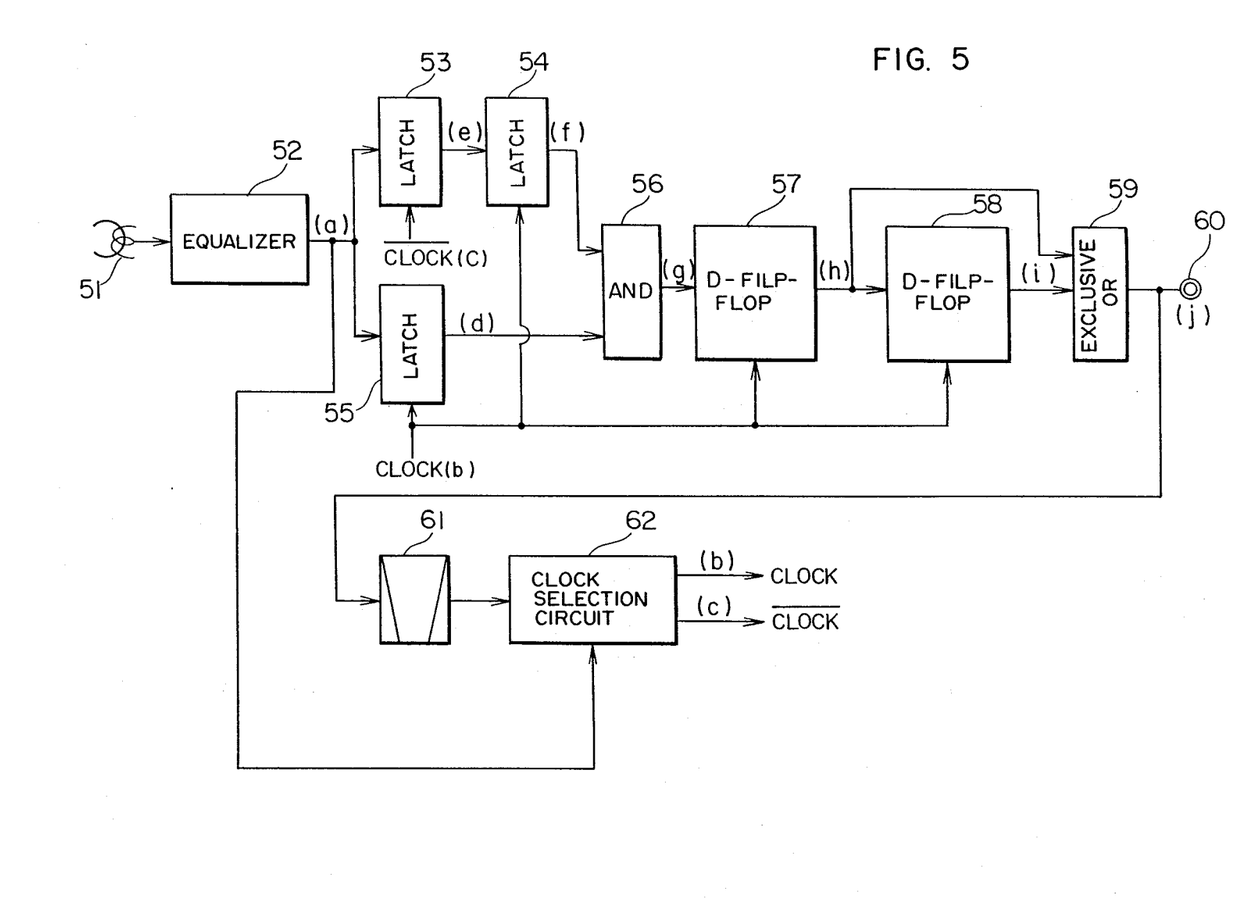
FIG. 5 is a block diagram showing another embodiment of a demodulation circuit according to the present invention.
Figure 6:
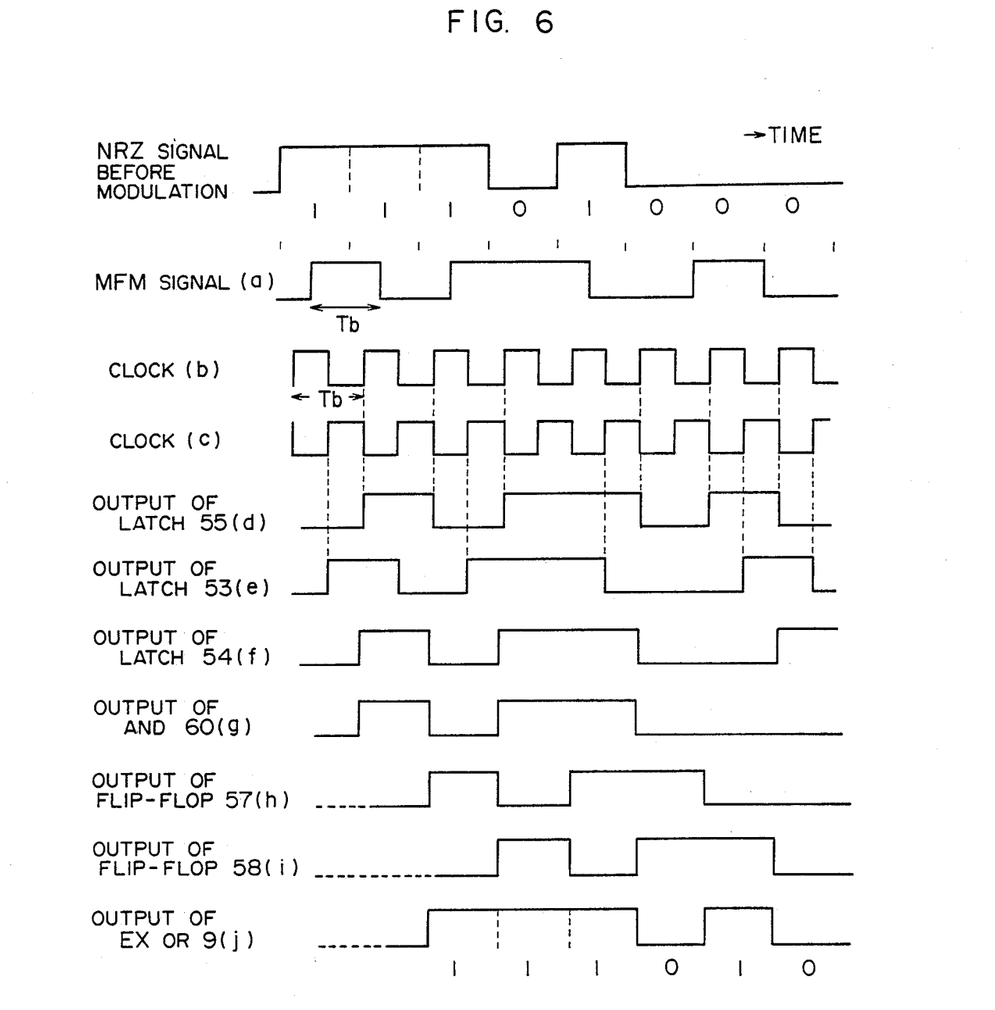
FIG. 6 is a timing chart showing signal waveforms at various portions of the circuit of FIG. 5.

FIG. 5 is a block diagram showing the circuit configuration of a typical example of this embodiment. FIG. 6 shows signal waveforms appearing at various portions of the circuit illustrated in FIG. 5. FIG. 5 is a circuit diagram used when a demodulation circuit according to the present invention is applied to a magnetic recording/reproducing apparatus. In the present embodiment, an MFM signal, for example, is used as the modulated digital signal. In FIG. 5, a signal reproduced by a magnetic head 51 is supplied to an equalizer 52 for compensating the deterioration of the frequency response caused in the magnetic head system. The MFM signal (a) in recording operation is thus obtained.

The remaining portion of FIG. 5 following the circuit portion for obtaining the MFM signal (a) is roughly divided into three sections. A first section includes circuits 53, 54, 55 and 56 and produces a signal output (g) inverted by a datum "1". A second section includes circuits 57, 58 and 59 shown in FIG. 5 and produces a demodulated output of a modulated digital signal. A third section is a clock extraction and selection circuit section including circuits 61 and 62 shown in FIG. 5.

Clocks (b) and (c) for discriminating the MFM signal (a) are produced by the clock extraction circuit 61 and the selection circuit 62. Their periods are equal to the data transfer period $T_b$. That is to say, the clock extraction circuit 61 is supplied with a demodulated output (j) of NRZ type having the data transfer period $T_b$ and outputs a clock having the period $T_b$. In response to the clock and the MFM signal (a), the clock selection circuit 62 outputs the clocks (b) and (c).

The rising edge of the clock (b) is displaced by $T_b/4$ in time with respect to the rising/falling edge of a datum "1" of the MFM signal (a). The clock (c) is an inversion signal of the clock (b). Outputs (d) and (e) are respectively outputs of the latch circuits 55 and 53, which are obtained by latching the MFM signal (a) with the clocks (b) and (c), respectively. The output (e) is supplied to the latch circuit 54 and latched again therein by the clock (b) to produce an output (f).

Assuming that an original NRZ datum "1", i.e., an NRZ datum "1" before modulation in the middle of whose data transfer period the MFM signal is inverted is reference, the clock (c) precedes the clock (b) by a half period. Therefore, the information of an original datum "1" latched by the clock (c) and then latched by the clock (b) becomes equivalent to the information of an original datum "1" latched by the clock (b). For a portion of the MFM signal inverted in synchronism with the data transfer period on the basis of an original NRZ datum "0", however, two latch output signals (d) and (f) differ each other. By applying AND operation to the latch output signals (d) and (f) in the AND circuit 56 to compare the two signals and taking out coincident signals as the output, only the inverted outputs caused by original NRZ data "1" are extracted from the MFM signal (a). That is to say, an inverted output portion of the MFM signal (a) caused by original NRZ data "0" is not taken out by the AND gate 56.

Further, signals (h) and (i) having a relative phase difference equivalent to one period are produced by using D-flip-flops 57 and 58. The two signals (h) and (i) are supplied to an exclusive OR circuit 59. As the output of the exclusive OR circuit 59, a signal exhibiting a high potential corresponding to an original datum "1" and a low potential corresponding to an original datum "0", i.e., a so-called demodulated NRZ code (j) is obtained. The demodulated signal (j) is sent out at a terminal 60.

A part of the NRZ code (j) is supplied to the clock extraction circuit 61.

If the phase relationship between the MFM signal (a) and the clocks (b) and (c) is shifted, an original datum "1" and an original datum "0" are replaced, resulting in errors. Therefore, the clock selection circuit 62 is provided to establish clocks so that the clocks (b) and (c) may have correct relationship with respect to the MFM signal (a).

Figure 7:
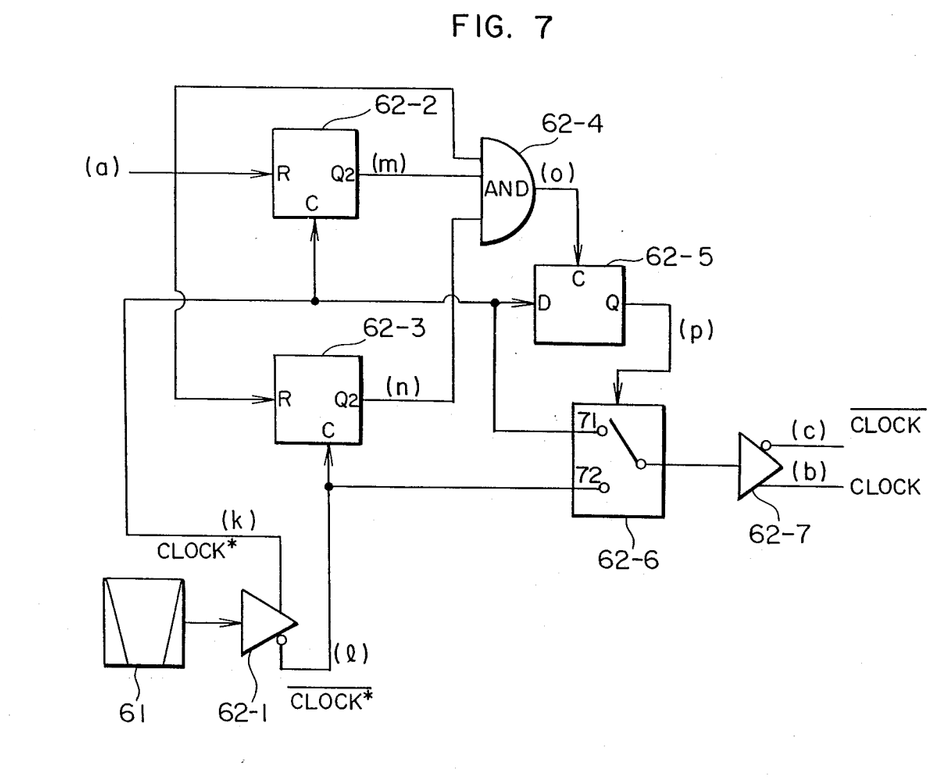
FIG. 7 is a detailed circuit diagram of a clock selection circuit shown in FIG. 5.
Figure 8:
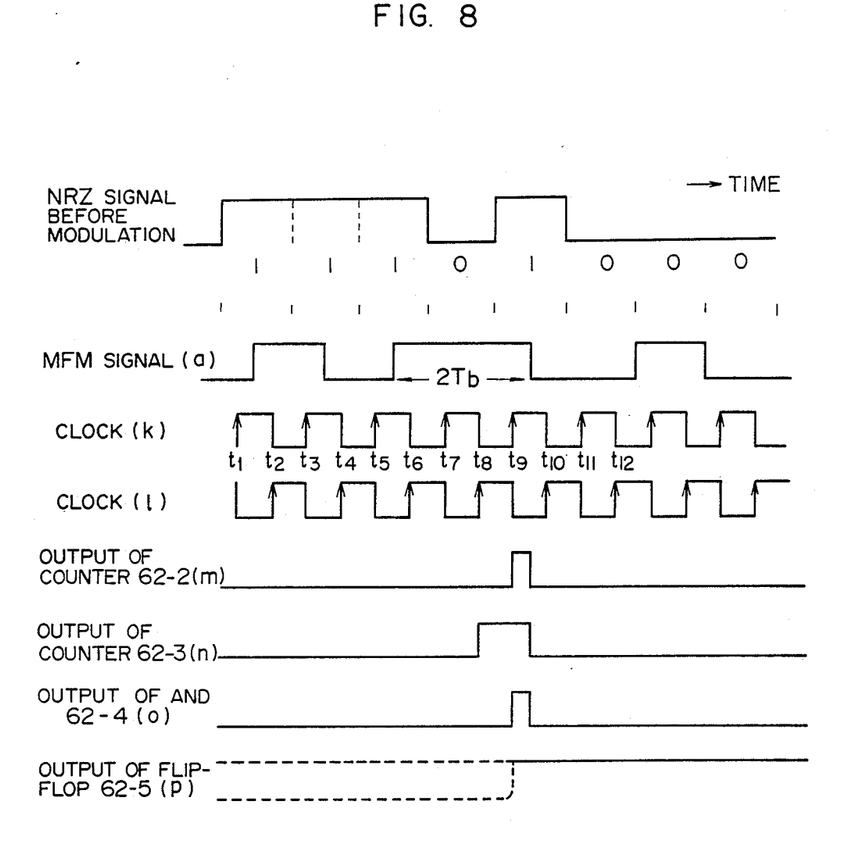
FIG. 8 is a timing chart showing signal waveforms at various portions of the circuit shown in FIG. 7.

FIG. 7 is a detailed configuration diagram of the clock selection circuit 62. FIG. 8 shows signal waveforms appearing at various portions of the circuit illustrated in FIG. 7. The selection and establishment of the clocks will now be described by referring to FIGS. 7 and 8.

In short, the output clock of the clock extraction circuit 61 is supplied to a buffer circuit 62-1 to produce a non-inverted clock (k) and an inverted clock (l). After either one of both clocks having normal phase relationship is selected by a selector 62-6, the selected clock and its inverted clock are sent out as the normal clock (b) and the clock (c).

In FIG. 7, the normal clock (b) and the inverted clock (c) are represented as clock and of the clock the relative relationship between the non-inverted clock and the inverted clock, while the clocks (k) and (l) before selection are represented as clock* and clock* to indicate the relative relationship in the same way.

How either the clock (k) or the clock (l) is selected will now be described in detail. For this purpose, the property of the MFM signal is used. That is to say, the maximum inversion interval $2T_b$ of the MFM signal is obtained when data before modulation are "101". Only during the maximum inversion interval, the clocks (k) and (Z) rise twice (between time $t_5$ and and time $t_{10}$ of FIG. 8). During each of the other inversion intervals, the clock rises only once. If clocks are counted between the rising edge and the falling edge of the MFM signal, the original data "101" causing the maximum inversion interval can be distinguished by distinguishing the count 2. Therefore, the phase relationship between the MFM signal (a) and the clocks are established as follows.

The clocks (k) and (l) are supplied to clock inputs C of 2-bit counters 62-2 and 62-3, respectively. The MFM signal is supplied to reset terminals R of the counters 62-2 and 62-3 so that respective counters may operate only while the MFM signal (a) is at a high logic level (i.e., high potential).

In a period (from time $t_5$ to time $t_{10}$) during which original data "101" appears at a high potential level, the output signals (m) and (n) of the 2-bit counters 62-2 and 62-3 are outputted as a high potential level at the time ($t_8$ and $t_9$) when the clocks (k) and (l) rise at the second bit. The output signals (m) and (n) of respective 2-bit counters and the MFM signal (a) are supplied to an AND circuit 62-4. The output signal (o) of the AND circuit 62-4 changes to a high potential level only when all of the MFM signal (a) and signals (m) and (n) are at high potential levels.

The clock (k) is supplied to a D input of a D-flip-flop 62-5, and the above described output signal (o) is supplied to a clock input c of the D-flip-flop 62-5. When the original data "101" at a high potential level appear, therefore, the state of the clock (k) (i.e., either a high potential state or a low potential state) is taken into the D-flip-flop 62-5 to appear as an output (p) by a rising edge of the signal (o). That is to say, the output (p) changes to a high potential level if the clock (k) is at a high potential level when the signal (o) rises as shown in FIG. 8. As a result, the clock (k) supplied to an illustrated terminal 71 is selected and used as the clock (b) by the selector 62-6.

If the input signal to the clock extraction circuit 61 becomes erroneous by some cause and hence the clocks (k) and (l) have phases opposite to those shown in FIG. 8, the output signal (p) is at a low potential level. At this time, an illustrated terminal 72 is selected and connected by the selector 62-6 to select the clock (l). In this case as well, the relationship between the MFM signal and the clocks (b) and (c) becomes normal.

If data corresponding to the pattern "101" of the original data formed by the high potential level appear in the MFM signal (a), the selection circuit functions so that the clocks (b) and (c) may always have the normal relationship with respect to the MFM signal (a) as described above.

Since only inverted portions caused by original data "1" are supplied to the clock extraction circuit of the present embodiment, clock generation becomes difficult if original data "0" continue excessively. Therefore, it is desirable to add a random fixed pattern to data to be modulated before the modulation using the MFM technique and demodulate the original data by eliminating the above described fixed pattern after demodulation.

Further, the phase between the clock and data becomes normal by the original data "101". Accordingly, it is possible to further enhance the effectiveness of the present embodiment by especially recording a pattern including a number of data "101" at the top of a recording track or by dividing the recording track into blocks and providing the recording pattern of the synchronization signal pattern recorded at the head of each block with a number of data "101".

The present embodiment is not restricted to modulated signals of the above described MFM technique, but may be applied to any modulated signals provided that the center and boundary of a bit period are selectively used. That is to say, the present embodiment can be applied to ZM signals and Miller$^2$ signals as well. It is thus possible to set the phase relationship between clock and modulated digital signal waveforms by detecting a specific pattern contained in these signals.

Since demodulation can be performed by using clocks having a period equivalent to the data transfer period in a demodulation circuit for MFM signal according to the present embodiment, it is possible to eliminate the use of high frequency clocks and constitute a demodulation circuit having high reliability. In addition, these effects are obtained for not only MFM signals but also any modulated signals selectively using the center and boundary of the bit period.

The circuit configuration (14–16, 22, 23) used in the embodiment of FIG. 1 for preventing false demodulation caused by an erroneous MFM pattern can be applied to the embodiment shown in FIG. 5. That is to say, the clock selection circuit of FIG. 7 may be configured so that the output of the AND gate 62-4 will be counted by a counter and the clock will be changed over upon arrival of the count at a predetermined value.

Further, the circuits 11 to 13 and 24 of the circuit shown in FIG. 1 may be replaced by the circuits 53 to 59 of FIG. 5 so that signals may be demodulated at a clock period equivalent to the period $T_b$ in the embodiment of FIG. 1 in the same way as the embodiment of FIG. 5.

We claim:

1. A demodulation circuit for demodulating a modulated digital signal comprising:
   an input terminal for inputting a modulated digital signal;
   means for detecting a specific pattern contained in the modulated digital signal thus inputted;
   means for extracting a clock signal from said modulated signal;
   means for judging a phase relationship between the specific pattern detected by said detection means and said extracted clock signal, said judging being performed to determine whether a phase of said extracted clock signal is coincident with a phase of the detected specific pattern;
   means for counting the number of times said phase of said extracted clock signal and said phase of said detected specific pattern are not coincident and providing a count in accordance with the result of judgment in said judging means;
   means for controlling the phase of said clock signal in accordance with the count in said counting means; and
   means for demodulating said modulated digital signal into a digital signal by using a phase controlled clock signal and said modulated digital signal inputted to said demodulation circuit.

2. A demodulation circuit for demodulating a modulated digital signal according to claim 1, wherein said modulated digital signal is formed by inverting polarities in accordance with a predetermined rule at two positions including a center and a boundary of a data transfer period respectively corresponding to data "1" and "0".

3. A demodulation circuit for demodulating a modulated digital signal according to claim 1, wherein
   said counting means increases the count by one when said judging means determines that the specific pattern differs from the clock signal in phase and said counting means clears the count when said judging means determines that the specific pattern is equivalent to the clock signal in phase; and wherein said control means inverts the phase of said clock signal when said count reaches a predetermined value.

4. A demodulation circuit for demodulating a modulated digital signal according to claim 2, wherein said modulated digital signal comprises a modified-frequency modulated signal, and said specific pattern comprises digital data "101" appearing in said digital signal.

5. A demodulation circuit for demodulating a modulated digital signal according to claim 2, wherein said modulated digital signal comprises a Miller$^2$ signal, and said specific pattern comprises digital data "0101" appearing in said digital signal.

6. A circuit for demodulating a modulated digital signal into a digital signal formed by inverting polarities in accordance with a predetermined rule at two positions including a center and a boundary of a data transfer period respectively corresponding to data "1" and "0", comprising:

first latch means for successively latching and outputting said modulated digital signal by a first clock and a second clock, each of said first clock and said second clock having a period equivalent to said data transfer period before modulation, said first clock being inverted in polarity with respect to said second clock;

second latch means for latching and outputting said modulated digital signal by using said second clock;

a first circuit for comparing an output of said first latch means with an output of said second latch means and for producing a signal output, said signal output being inverted upon occurrence of data "1" in said digital signal;

a second circuit for receiving two signal outputs from an output of said first circuit and for producing a demodulated output of said modulated digital signal on the basis of said two signal outputs, said two signal outputs are equivalent in waveform to said signal output which inverted upon occurrence of data "1" in said digital signal, said two signal outputs having a relative phase difference equivalent to one period;

a circuit for extracting two clocks having a period equivalent to said data transfer period from said demodulated output, one of said two clocks being inverted in polarity to the other of said two clocks; and a clock selection circuit for detecting a specific pattern contained in said modulated digital signal and for selectively outputting said two extracted clocks as said first and second clocks on the basis of a phase relation between the detected specific pattern and said two extracted clocks.

7. A demodulation circuit for demodulating a modulated digital signal according to claim 6, wherein said modulated digital signal includes a modified frequency modulated signal, and said specific pattern includes digital data "101" in said digital signal.

8. A demodulation circuit for modulated digital signal according to claim 6, wherein said second circuit comprises a flip-flop circuit for taking out two signal outputs by delaying the output of said first circuit in response to said second clock by an integer times the period of said second clock and an exclusive OR circuit for producing the demodulated output of said modulated digital signal from said two output signals, said two output signals are equivalent in waveform to said signal output inverted upon occurrence of data "1" in said digital signal, said two output signals having a relative phase difference equivalent to one period.

* * * * *

UNITED STATES PATENT AND TRADEMARK OFFICE
CERTIFICATE OF CORRECTION

PATENT NO. : 4,868,853
DATED : September 19, 1989
INVENTOR(S) : M. IZUMITA et al It is certified that error appears in the above-identified patent and that said Letters Patent is hereby corrected as shown below:

On the title page:
Please correct the Assignee for the above referenced U.S. Patent, no. 4,868,853, by adding the following name:

HITACHI DENSHI KABUSHIKI KAISHI

Signed and Sealed this

Twenty-ninth Day of January, 1991

Attest:

HARRY F. MANBECK, JR.

Attesting Officer

Commissioner of Patents and Trademarks